(12) United States Patent
Zhang et al.

(10) Patent No.: US 11,697,265 B2
(45) Date of Patent: Jul. 11, 2023

(54) SUPPORT STRUCTURE AND MANUFACTURING METHOD THEREOF, AND FOLDABLE DISPLAY SCREEN

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Na Zhang, Beijing (CN); Bin Zhang, Beijing (CN); Jing Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 329 days.

(21) Appl. No.: 16/936,837

(22) Filed: Jul. 23, 2020

(65) Prior Publication Data
US 2021/0026420 A1    Jan. 28, 2021

(30) Foreign Application Priority Data
Jul. 25, 2019   (CN) .......................... 201910675256.5

(51) Int. Cl.
*B32B 3/30*    (2006.01)
*B32B 7/12*    (2006.01)
(Continued)

(52) U.S. Cl.
CPC .................. *B32B 3/30* (2013.01); *B32B 7/12* (2013.01); *B32B 15/18* (2013.01); *B32B 3/14* (2013.01);
(Continued)

(58) Field of Classification Search
CPC .. B32B 3/30; B32B 7/12; B32B 15/18; B32B 3/14; B32B 15/043; B32B 17/061; B32B 2311/00; B32B 2457/206
(Continued)

(56) References Cited

U.S. PATENT DOCUMENTS

2017/0357289 A1* 12/2017 Ahn ........................ B32B 7/12
2018/0103553 A1    4/2018 Kim et al.
2021/0026420 A1*  1/2021 Zhang .................. G06F 1/1637

FOREIGN PATENT DOCUMENTS

CN     108766247 A    11/2018
CN     208622353 U     3/2019
(Continued)

OTHER PUBLICATIONS

Foldable Display Device, KR 20170061313 A, Park et al. English Translated. (Year: 2017).*
(Continued)

*Primary Examiner* — Betelhem Shewareged
(74) *Attorney, Agent, or Firm* — Muncy, Geissler, Olds & Lowe, P.C.

(57) ABSTRACT

The present disclosure provides a support structure and a manufacturing method thereof, and a foldable display screen. The support structure includes: a first support plate made of flexible conductive material; at least two second support plates arranged on the first support plate with interval, the second support plates being made of rigid conductive material, at least a part of surface of each of the second support plates being in contact with the first support plate.

19 Claims, 3 Drawing Sheets

(51) Int. Cl.
*B32B 15/18* (2006.01)
*B32B 15/04* (2006.01)
*B32B 3/14* (2006.01)
*B32B 17/06* (2006.01)

(52) U.S. Cl.
CPC ........... *B32B 15/043* (2013.01); *B32B 17/061* (2013.01); *B32B 2311/00* (2013.01); *B32B 2457/206* (2013.01)

(58) Field of Classification Search
USPC ..................................................... 428/195.1
See application file for complete search history.

(56) References Cited

FOREIGN PATENT DOCUMENTS

| | | | |
|---|---|---|---|
| CN | 109712530 A | 5/2019 | |
| CN | 208861607 U | 5/2019 | |
| CN | 208922656 U | 5/2019 | |
| CN | 109859630 A | 6/2019 | |
| KR | 20170061313 A | * 6/2017 | ............. G09F 9/301 |

OTHER PUBLICATIONS

Chinese Office Action with English translation, cited in counterpart application No. 2019106752565 dated Dec. 1, 2020. 17 pages.
Office Action, with English translation, issued in corresponding CN application No. 201910675256.5, dated Jul. 6, 2021 (23 pages).

* cited by examiner

SUPPORT STRUCTURE AND MANUFACTURING METHOD THEREOF, AND FOLDABLE DISPLAY SCREEN

CROSS-REFERENCE TO RELATED APPLICATION

The present application claims the priority of Chinese Patent Application No. 201910675256.5 filed on Jul. 25, 2019, the contents of which are incorporated herein in their entirety by reference.

TECHNICAL FIELD

The present disclosure relates to the field of display technology, and in particular to a support structure and a manufacturing method thereof, and a foldable display screen.

BACKGROUND

Currently, a flexible display panel, such as a foldable OLED display, usually includes a rigid body area for display and a foldable area for bending. For a support structure of the flexible display panel, at least a hard support plate and a flexible support plate are typically used to provide support for the flexible display panel.

SUMMARY

In a first aspect, an embodiment of the present disclosure provides a support structure applied to a foldable display screen. The support structure includes:
 a first support plate made of flexible conductive material;
 at least two second support plates arranged on the first support plate with interval, the second support plates being made of rigid conductive material, at least a part of surface of each of the second support plates being in contact with the first support plate.

Optionally, a side surface of the second support plate facing the first support plate has a recess region and a contact region, the recess region is provided with a recess, and the contact region is in contact with the first support plate;
 the recess is filled with adhesive for bonding the first support plate and the second support plate, and a surface of the adhesive in contact with the second support plate is flush with a surface of the contact region.

Optionally, a side surface of the second support plate facing the first support plate has a plurality of recess regions arranged in an array.

Optionally, a cross section of the recess is round, oval, square or rhombus.

Optionally, the first support plate is made of stainless steel.

Optionally, the second support plate is made of metal material.

Optionally, the metal material is steel.

Optionally, the adhesive is optically clear adhesive.

In a second aspect, an embodiment of the present disclosure provides a foldable display screen including: a flexible display panel and a support structure provided on a side of the flexible display panel, wherein the support structure is the support structure mentioned above.

Optionally, the flexible display panel is a flexible organic light emitting diode display panel.

In a third aspect, an embodiment of the present disclosure provides a manufacturing method of a support structure, including:
 providing a first support plate made of flexible conductive material;
 providing at least two second support plates made of rigid conductive material, a side surface of the second support plate having a recess region and a contact region;
 forming a recess in the recess region;
 filling the recess with adhesive, a surface of the adhesive after filling being flush with a surface of the contact region;
 laminating the at least two second support plates onto the first support plate, the at least two second support plates being arranged with interval, and the contact region of the second support plate being in contact with the first support plate.

BRIEF DESCRIPTION OF THE DRAWINGS

By reading the detailed description of the preferred embodiments below, various other advantages and benefits will become apparent to those of ordinary skill in the art. The drawings are only used for the purpose of illustrating the preferred embodiments, and are not considered as a limitation to the present disclosure. Moreover, throughout the drawings, the same reference numerals are used to denote the same components. In the drawings.

DETAILED DESCRIPTION

The technical solutions in the embodiments of the present disclosure will be described clearly and thoroughly with reference to the accompanying drawings in the embodiments of the present disclosure. Obviously, the described embodiments are part of the embodiments of the present disclosure, not all of the embodiments. Based on the embodiments in the present disclosure, all other embodiments obtained by those of ordinary skill in the art without creative work shall fall within the protective scope of the present disclosure.

Figure 1:
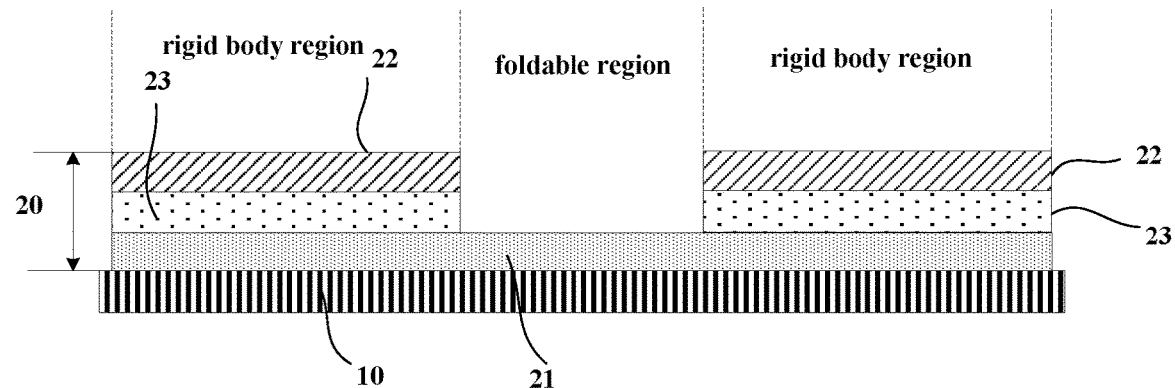
FIG. 1 is a schematic cross-sectional view of a foldable display screen in the related art.

As shown in FIG. 1, a foldable display screen includes: a flexible display panel 10 and a support structure 20 provided on the flexible display screen 10. The support structure 20 includes a flexible support plate 21 and two high-strength rigid support plates 22. Both the flexible support plate 21 and the rigid support plates 22 are made of conductive materials. The rigid support plates 22 are provided in the rigid body region of the foldable display screen. A foldable region of the foldable display screen is formed between the two rigid support plates 22. In order to ensure that the rigid support plates 22 are not misaligned during the folding process of the foldable display screen, a high-strength adhesive 23 is required to bond the rigid support plates 22 to the flexible support plate 21.

The disadvantage of the above solution is that: the two rigid support plates 22 form an isolated body, respectively, and are not connected with each other, thus, in an Electro-Static Discharge (ESD) environment, static electricity may accumulate on one of the rigid support plates 22 and cannot be discharged, which may inevitably damage the foldable display screen, resulting in a defective foldable display screen, such as poor lines or abnormal display, etc.

The embodiments of the present invention provide a support structure and a manufacturing method thereof, and a foldable display screen, which are used to solve the problem of a defective foldable display screen caused by the inability of the existing support structure to discharge static electricity.

Figure 2:
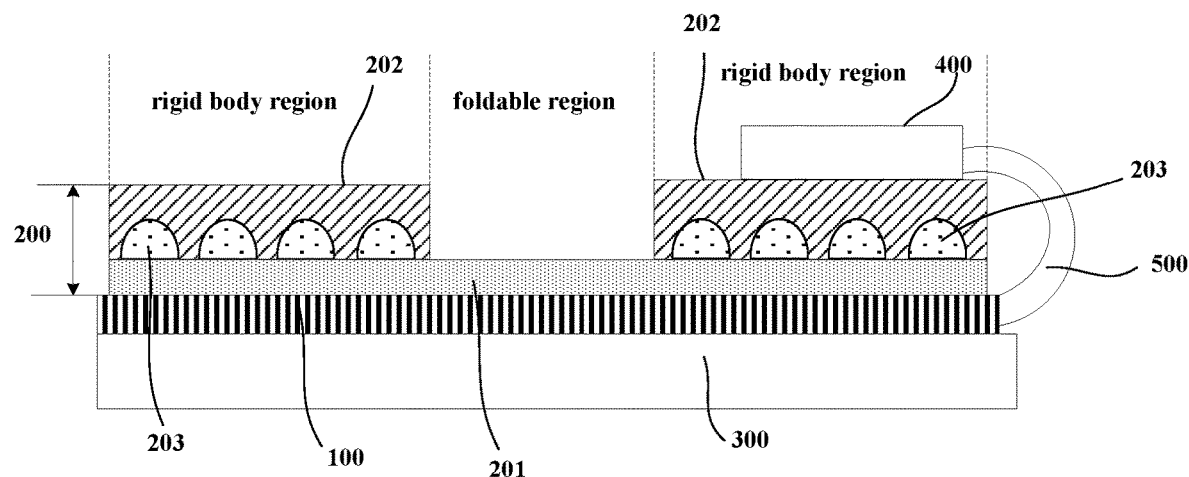
FIG. 2 is a schematic cross-sectional view of a foldable display screen according to an embodiment of the present disclosure.

Referring to FIG. 2, it is a structural diagram of a foldable display screen according to an embodiment of the present disclosure. The foldable display screen includes: a flexible display panel 100 and a support structure 200 provided on a side of the flexible display panel 100. The support structure 200 is used to provide support for the flexible display panel 100.

In the embodiment of the present disclosure, the support structure 200 may be bonded and covered onto the flexible display panel by adhesive such as optically clear adhesive (OCA) and the like.

Figure 3:
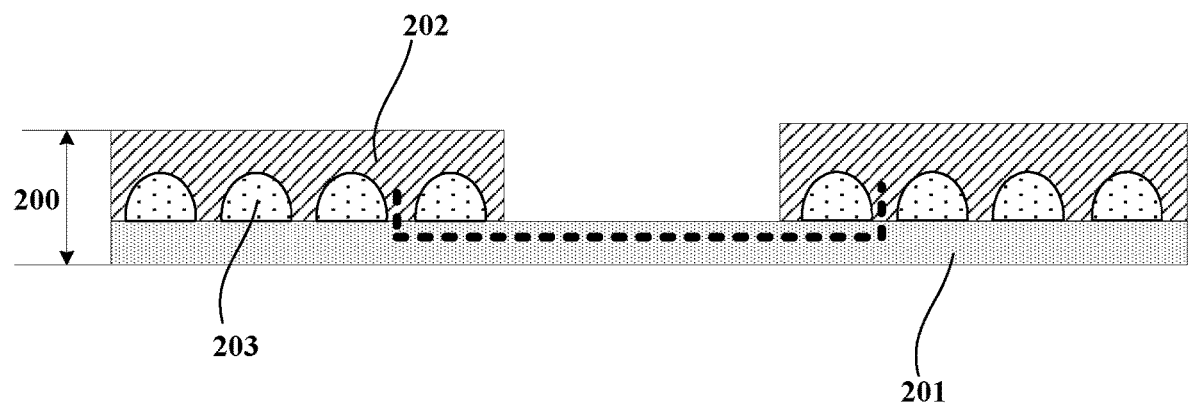
FIG. 3 is a schematic cross-sectional view of a support structure according to an embodiment of the present disclosure.
Figure 4:
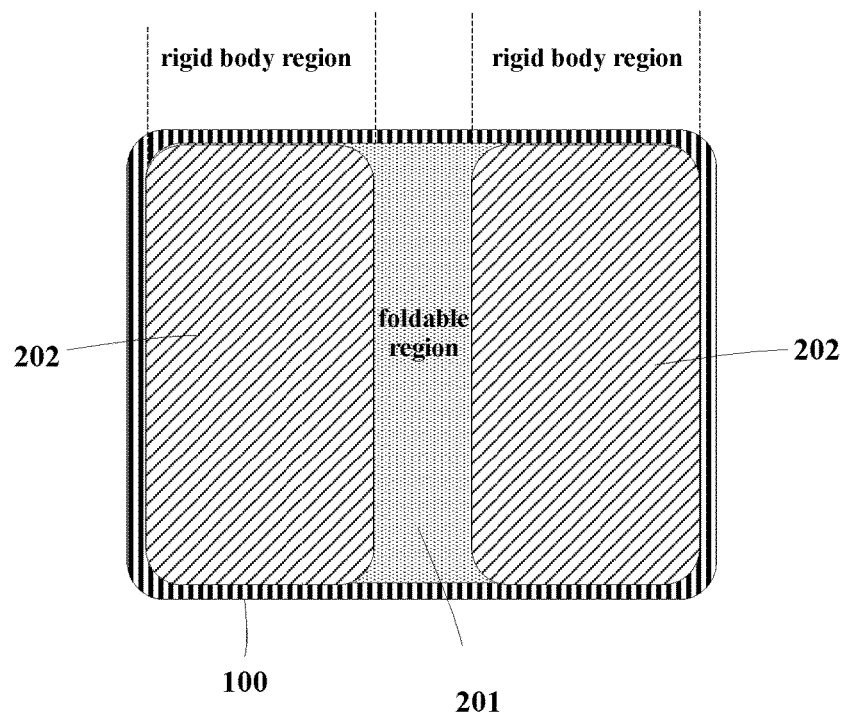
FIG. 4 is a schematic top view of a support structure according to an embodiment of the present disclosure.

Referring to FIGS. 2, 3 and 4 at the same time, the support structure 200 includes:

a first support plate 201, which is made of flexible conductive material; that is, the first support plate 201 is bendable.

two second support plates 202 provided on the first support plate 201; the second support plates 202 are made of rigid conductive material, that is, the second support plates 202 are not bendable. The two second support plates 202 are spaced apart. A region where the two second support plates 202 are located forms a rigid body region of the foldable display screen, and a region between the two second support plates 202 forms a foldable region of the foldable display screen. According to the embodiment of the present disclosure, at least a part of a surface of each second support plate is in contact with the first support plate, so that these second support plates 202 can be electrically connected with each other through the first support plate 201 and static electricity can be discharged, and thus the foldable display screen is protected from being damaged by ESD.

Optionally, a side surface of the second support plate 202 facing the first support plate 201 has a recess region and a contact region, the recess region is provided with a recess, and the contact region is in contact with the first support plate 201;

the recess region is filled with adhesive 203 for bonding the first support plate 201 and the second support plate 202, and a surface of the adhesive 203 in contact with the second support plate 202 is flush with a surface of the contact region, so that the contact region of the second support plate 202 can contact the first support plate 201, and the first support plate 201 and the second support plate 202 can be bonded fully.

Referring to FIG. 3, in the embodiment of the present disclosure, since the contact regions of the second support plates 202 are in direct contact with the first support plate 201, the two second support plates 202 can be connected with each other through the first support plate 201, as illustrated by the dashed connection line in FIG. 3. By grounding one of the second support plates 202 or by grounding the first support plate 201, static electricity does not accumulate on the second support plates 202 and can be fully discharged, so that the foldable display can be protected from ESD. Meanwhile, by providing recesses in the second support plates 202 and filling the adhesive 203 in the recesses, the second support plates 202 and the first support plate 201 can be firmly bonded to each other.

In the embodiment of the present disclosure, since the contact regions of the second support plates of the support structure are in direct contact with the first support plate, at least two second support plates can be connected with each other through the first support plate and thus static electricity can be fully discharged, so that the foldable display can be protected from being damaged by ESD.

In an embodiment of the present disclosure, referring to FIG. 4, there are two second support plates 202 arranged with interval, and the foldable display screen can be bended in the foldable region. However, in the present disclosure, the number of the second support plates 202 is not limited to this. In some other embodiments of the present disclosure, the number of the second support members 202 may also be more than two, so as to provide more folding modes for the folding display screen.

In an embodiment of the present disclosure, optionally, a side surface of the second support plate 202 facing the first support plate 201 has a plurality of recess regions arranged in an array.

In an embodiment of the present disclosure, optionally, a cross section of the recess is round, oval, square or rhombus.

In an embodiment of the present disclosure, optionally, the first support plate 201 is made of stainless steel (SUS). This material has certain rigidity and is bendable.

In an embodiment of the present disclosure, optionally, the second support plate 202 is made of metal material. The metal material has high stiffness and excellent conductibility.

In an embodiment of the present disclosure, optionally, the metal material is steel. The steel has high stiffness and can provide better support.

In an embodiment of the present disclosure, optionally, the adhesive is optically clear adhesive (OCA). The OCA has strong viscosity and can improve the adhesion between the first support plate 201 and the second support plates 202. Of course, in some other embodiments of the present disclosure, other types of adhesives can also be used.

In an embodiment of the present disclosure, optionally, conductive particles are doped in the OCA, so as to further make the region regions also have conductibility.

In an embodiment of the present disclosure, optionally, the flexible display panel is a flexible organic light emitting diode (OLED) display panel.

In an embodiment of the present disclosure, referring to FIG. 2, the foldable display screen may further include a cover plate which is provided on the other side of the flexible display panel 100 and protects the flexible display panel 100.

In an embodiment of the present disclosure, referring to FIG. 2, the foldable display screen may further include a driver circuit board 400 which is provided on a side of one of the second support plates 202 facing away from the first support plate 201. The driver circuit board 400 is connected to the flexible display panel 100 through a conductive tape 500 and is used to provide a driving signal to the flexible display panel 100. The driver circuit board 400 may be an MFPC+COF (Chip On Flex or Chip On Film).

Figure 5:
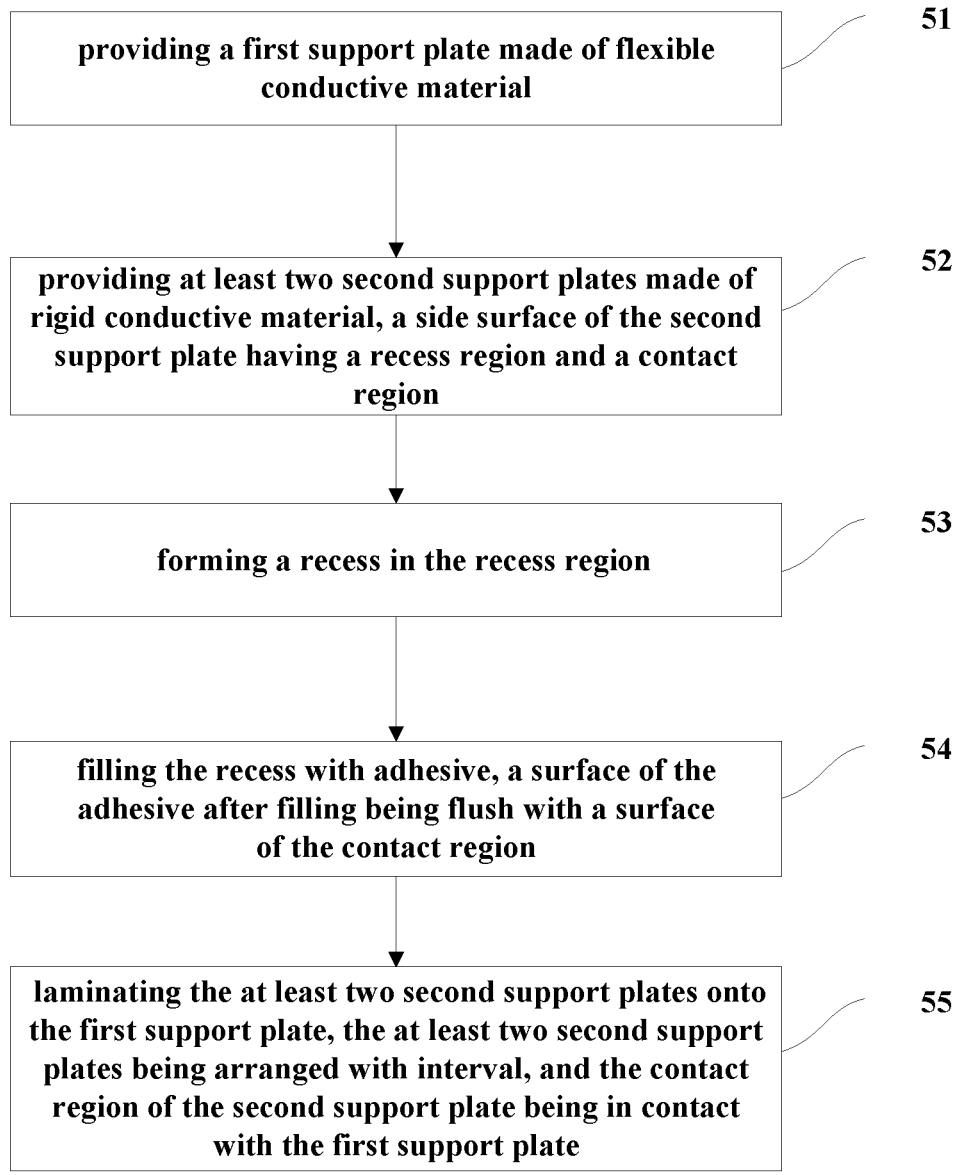
FIG. 5 is a schematic flowchart of a manufacturing method of a support structure according to an embodiment of the present disclosure.

Referring to FIG. 5, it is a schematic flowchart of a manufacturing method of a support structure according to an embodiment of the present disclosure. The manufacturing method includes:

Step 51: providing a first support plate made of flexible conductive material;

Step 52: providing at least two second support plates made of rigid conductive material, a side surface of the second support plate having a recess region and a contact region;

Step 53: forming a recess in the recess region;

Step 54: filling the recess with adhesive, a surface of the adhesive after filling being flush with a surface of the contact region;

Step 55: laminating the at least two second support plates onto the first support plate, the at least two second support plates being arranged with interval, and the contact region of the second support plate being in contact with the first support plate.

The support structure formed by the above method can not only provide support for the foldable display screen, but also fully discharge static electricity, so as to achieve the purpose of protecting the folding display screen from being damaged by ESD.

The embodiments of the present disclosure are described above with reference to the accompanying drawings. However, the present disclosure is not limited to the above specific embodiments. The above specific embodiments are only illustrative and not restrictive. Many forms can be made by those of ordinary skill in the art under the enlightenment of the present disclosure without departing from the purpose of the present disclosure and the protective scope of the claims, all of which fall within the protective scope of the present disclosure.

What is claimed is:

1. A support structure applied to a foldable display screen, comprising:
   a first support plate made of flexible conductive material; and
   at least two second support plates arranged on the first support plate with interval, the second support plates being made of rigid conductive material, at least a part of surface of each of the second support plates being in contact with the first support plate,
   wherein a side surface of the second support plate facing the first support plate has a recess region and a contact region, the recess region is provided with a recess, and the contact region is in contact with the first support plate, and
   wherein the recess is filled with adhesive for bonding the first support plate and the second support plate, and a surface of the adhesive in contact with the second support plate is flush with a surface of the contact region.

2. The support structure according to claim 1, wherein a side surface of the second support plate facing the first support plate has a plurality of recess regions arranged in an array.

3. The support structure according to claim 1, wherein a cross section of the recess is round, oval, square or rhombus.

4. The support structure according to claim 1, wherein the first support plate is made of stainless steel.

5. The support structure according to claim 1, wherein the second support plate is made of metal material.

6. The support structure according to claim 5, wherein the metal material is steel.

7. The support structure according to claim 1, wherein the adhesive is optically clear adhesive.

8. A foldable display screen, comprising: a flexible display panel and a support structure provided on a side of the flexible display panel, wherein the support structure is the support structure according to claim 1.

9. The foldable display screen according to claim 8, wherein the flexible display panel is a flexible organic light emitting diode display panel.

10. A manufacturing method of a support structure, comprising:
    providing a first support plate made of flexible conductive material;
    providing at least two second support plates made of rigid conductive material, a side surface of the second support plate facing the first support plate having a recess region and a contact region, and the contact region is in contact with the first support plate;
    forming a recess in the recess region;
    filling the recess with adhesive for bonding the first support plate and the second support plate, a surface of the adhesive after filling being flush with a surface of the contact region;
    laminating the at least two second support plates onto the first support plate, the at least two second support plates being arranged with interval, and the contact region of the second support plate being in contact with the first support plate.

11. A support structure applied to a foldable display screen, comprising:
    a first support plate made of flexible conductive material; and
    at least two second support plates arranged on the first support plate with interval, the second support plates being made of rigid conductive material, at least a part of surface of each of the second support plates being in contact with the first support plate,
    wherein a side surface of the second support plate facing the first support plate has a plurality of recess regions arranged in an array.

12. The support structure according to claim 11, wherein a side surface of the second support plate facing the first support plate has a contact region, each of the plurality of recess regions is provided with a recess, and the contact region is in contact with the first support plate, and
    wherein the recess is filled with adhesive for bonding the first support plate and the second support plate, and a surface of the adhesive in contact with the second support plate is flush with a surface of the contact region.

13. The support structure according to claim 12, wherein a cross section of the recess is round, oval, square or rhombus.

14. The support structure according to claim 11, wherein the first support plate is made of stainless steel.

15. The support structure according to claim 11, wherein the second support plate is made of metal material.

16. The support structure according to claim 15, wherein the metal material is steel.

17. The support structure according to claim 12, wherein the adhesive is optically clear adhesive.

18. A foldable display screen, comprising:
    a flexible display panel; and
    a support structure, according to claim 12, provided on a side of the flexible display panel.

19. The foldable display screen according to claim 18, wherein the flexible display panel is a flexible organic light emitting diode display panel.

* * * * *